United States Patent [19]

Haase et al.

[11] Patent Number: 5,513,199
[45] Date of Patent: Apr. 30, 1996

[54] BLUE-GREEN LASER DIODE

[75] Inventors: Michael A. Haase, Woodbury; James M. DePuydt, Stillwater; Hwa Cheng; Jun Qiu, both of Woodbury, all of Minn.

[73] Assignee: Minnesota Mining and Manufacturing Company, St. Paul, Minn.

[21] Appl. No.: 400,665

[22] Filed: Mar. 8, 1995

Related U.S. Application Data

[60] Continuation of Ser. No. 147,844, Nov. 5, 1993, abandoned, which is a division of Ser. No. 700,606, May 15, 1991, and a division of Ser. No. 873,647, Apr. 23, 1992, Pat. No. 5,291,507, which is a continuation of Ser. No. 700,601, May 15, 1991, abandoned.

[51] Int. Cl.$^6$ ..................................................... H01S 3/19
[52] U.S. Cl. ................................. 372/44; 372/50
[58] Field of Search ................... 372/44, 45; 378/46, 378/50

[56] References Cited

U.S. PATENT DOCUMENTS

| | | | |
|---|---|---|---|
| 4,534,033 | 8/1985 | Nishizawa et al. | 372/50 |
| 4,607,369 | 8/1986 | Niina et al. | 372/46 |
| 4,727,557 | 2/1988 | Burnham et al. | 257/22 |
| 4,735,662 | 4/1988 | Szabo et al. | 136/256 |

(List continued on next page.)

FOREIGN PATENT DOCUMENTS

| | | |
|---|---|---|
| 0380106A3 | 8/1990 | European Pat. Off. . |
| 60-178684A | 9/1985 | Japan . |
| 2226698A | 7/1990 | United Kingdom . |

OTHER PUBLICATIONS

Ser. No. 08/017,115 filed Feb. 12, 1993, Haase et al.
"Short Wavelength II–VI Laser Diodes", Haase et al., Inst. Phys. Conf. Ser. No. 120: Chapter 1 (Feb., 1992).
"Optically Pumped Blue–Green Laser Operation Above Room–Temperature in $Zn_{0.80}Cd_{0.20}SeZnS_{0.08}Se_{0.92}$ Multiple Quantum Well Structures Grown by Metalorganic Molecular Beam Epitaxy", Kawakami et al., Japanese Journal of Applied Physics, vol. 30, pp. L–605–607 (Apr. 1991).
Pseudomorphic $In_yGa_{1-y}As/GaAs/Al_{1-x}As$ Single Quantum Well Surface–Emitting Lasers With Integrated 45° Beam Deflectors, Kim et al., Appl. Phys. Lett., vol. 58, pp. 7–9, (Jan. 1991).
"Molecular Beam Epitaxy Growth of ZnSe Using a Cracked Selenium Source", Cheng et al., J. Voc. Sc. Tech., Vol. B8, p. 181 (Mar./Apr. 1990).
"Growth of P— and N–Type ZnSe By Molecular Beam Epitaxy," Cheng et al., J. Crystal Growth, vol. 95, p. 512 (Feb. 1989).
"Molecular Beam Epitaxy of CdSe and the Derivaaative Alloys $Zn_{1-x}Cd_xSe$ and $Cd_{1-x}Mn_xSe$," Samarth et al., J. Electronic Materials, vol. 19, p. 543 (Jun. 1990).
"Optimum Composition in $MBE-ZnS_xSe_{1-x}/GaAs$ for High Quality Heteroepitaxial Growth," Matsumura et al., J. Crystal Growth, vol. 99, p. 446 (Jan. 1990).
"Laser Action in the Blue–Green from Optically Pumped (Zn,Cd)Se/ZnSe Single Quantum Well Structures", Ding et al., Appl. Phys. Lett., vol. 57, p. 2756 (Dec. 1990).
"Electron Beam Pumped II–VI Lasers", Colak et al., J. Crystal Growth, vol. 72, p. 504 (Jul./Aug. 1985).

(List continued on next page.)

Primary Examiner—Leon Scott, Jr.
Attorney, Agent, or Firm—Faegre & Benson

[57] ABSTRACT

A II–VI compound semiconductor laser diode includes a plurality of layers of II–VI semiconductor forming a pn junction supported by a single crystal GaAs semiconductor substrate. The layers forming the pn junction include a first cladding layer of a first conductivity type, a second cladding layer of a second conductivity type, and at least a first guiding layer between the first and second cladding layers. A CdZnSe or other II–VI semiconductor quantum well active layer is positioned within the pn junction. Electrical energy is coupled to the laser diode by first and second electrodes.

51 Claims, 7 Drawing Sheets

U.S. PATENT DOCUMENTS

| | | |
|---|---|---|
| 4,856,013 | 8/1989 | Iwano et al. |
| 4,868,615 | 9/1989 | Kamata .................................. 357/17 |
| 4,894,833 | 1/1990 | Carlin .................................... 372/44 |
| 4,926,433 | 5/1990 | Imamura et al. ..................... 372/50 |
| 4,957,337 | 9/1990 | Ogawa et al. ....................... 257/429 |
| 4,959,106 | 9/1990 | Nakagawa et al. ................. 136/258 |
| 4,963,507 | 10/1990 | Amann et al. ...................... 437/130 |
| 4,989,214 | 1/1991 | Kwa ..................................... 372/50 |
| 4,995,047 | 2/1991 | Hadley et al. ....................... 372/50 |
| 4,995,687 | 2/1991 | Nagai et al. ........................ 350/96.2 |
| 5,008,891 | 4/1991 | Morita .................................. 372/45 |
| 5,032,879 | 7/1991 | Buchmann et al. ................ 257/522 |
| 5,037,709 | 8/1991 | Tomomura ........................... 428/690 |
| 5,081,632 | 1/1992 | Migita et al. ........................ 372/45 |
| 5,140,149 | 8/1992 | Sakata et al. ....................... 257/13 |
| 5,155,738 | 10/1992 | Ijichi et al. .......................... 257/18 |
| 5,157,467 | 10/1992 | Fujii ..................................... 257/24 |
| 5,200,869 | 4/1993 | Paoli .................................... 372/20 |
| 5,219,785 | 6/1993 | Welch et al. ........................ 257/79 |
| 5,248,631 | 9/1993 | Park et al. ........................... 437/105 |
| 5,291,507 | 3/1994 | Haase et al. ........................ 372/44 |
| 5,325,379 | 6/1994 | Amann ................................. 372/20 |

OTHER PUBLICATIONS

"Electron Beam Pumped Lasing in ZnSe Grown by Molecular Beam Epitaxy", Potts et al., Appl. Phys. Lett. vol. 50, p. 7 (Jan. 1987).

Sze, "Physics of Semiconductor Devices", 2nd ed. pp. 681–742 (Sep. 1981).

"Blue–Green Laser Diodes", Haase et al., Appl. Phys. Lett. vol. 59, pp. 1272–1274 (Sep. 1991).

"Metalorganic Vapaor Phase Epitaxy of Low Resistivity P–Type ZnSe", Yasuda et al., Appl. Phys. Lett., vol. 52, p. 57 (Jan. 1988).

"P–Type ZnSe by Nitrogen Atom Beam Doping During Molecular Beam Epitaxial Growth," Park et al., Appl. Phys. Lett., vol. 57, p. 2127 (Nov. 1990).

"Low Temperature Growth of ZnSe by Molecular Beam Epitaxy Using Cracked Selenium", Chen et al., Appl. Phys. Lett., vol. 56, p. 848 (Feb. 1990).

"Defects in Epitaxial Multilayers", Matthews et al., J. Crystal Growth, vol. 27, p. 118 (Nov./Dec. 1974).

Toshihisa Tsukada, GaAs–$Ga_{1-x}Al_xAs$ Buried–Heterostructure Injection Lasers, J. Appl. Physics, vol. 45, pp. 4899–4906 (Nov. 1974).

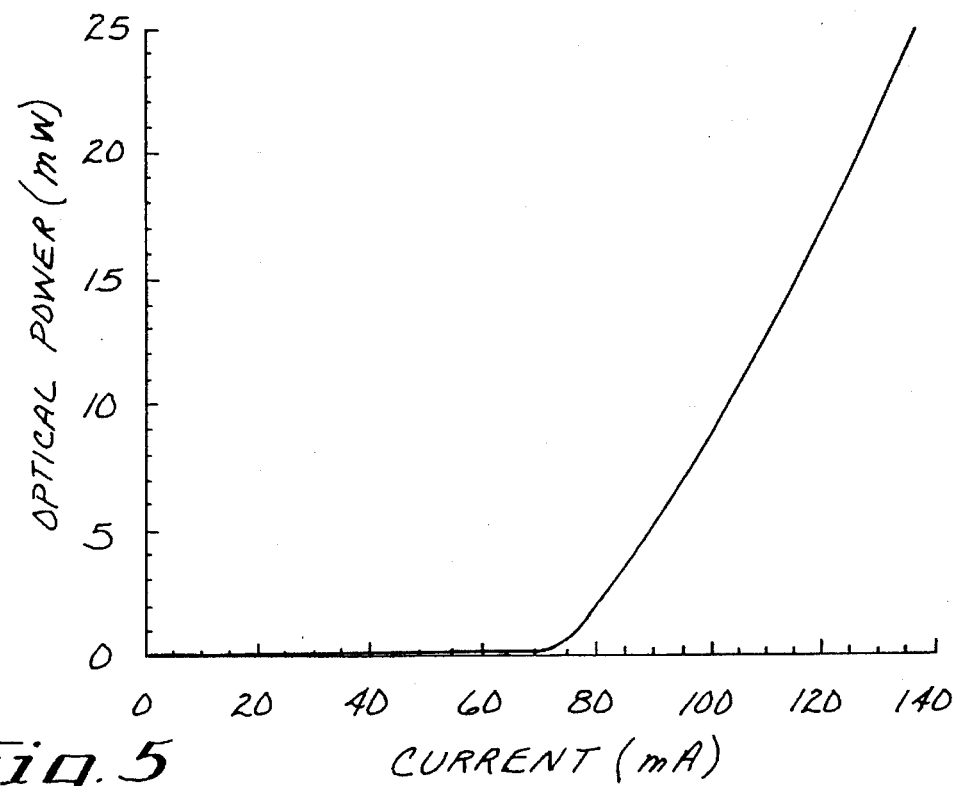
Fig. 5
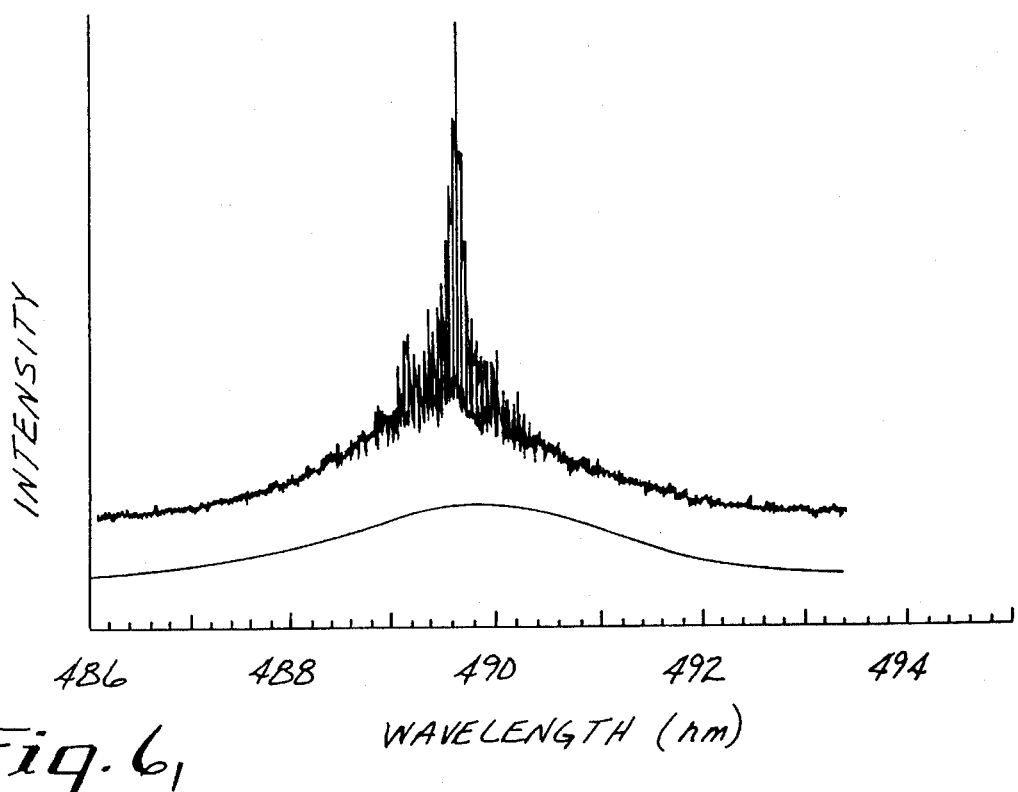
Fig. 6₁

BLUE-GREEN LASER DIODE

REFERENCE TO RELATED APPLICATIONS

This application is a continuation of Ser. No. 08/147,844, abandoned Jun. 17, 1995, which is a division of the following and commonly assigned applications:

1. Haase et al. Ser. No. 07/873,647, filed Apr. 23, 1992, now U.S. Pat. No. 5,241,507 and entitled Blue-Green Laser Diode, a continuation of Ser. No. 07/700,601, filed May 15, 1991 and now abandoned.

2. DePuydt et al. Ser. No. 07/700,606, filed May 15, 1991 and allowed Jun. 22, 1993 entitled Ohmic Contact For P-Type Group II–VI Compound Semiconductors.

BACKGROUND OF THE INVENTION

The present invention relates generally to semiconductor laser diodes. In particular, the present invention is a laser diode fabricated from Group II–VI compound semiconductors which emits coherent radiation in the blue and green portion of the spectrum. Semiconductor laser diodes are generally known and disclosed, for example, in Chapter 12 of Sze, *Physics of Semiconductor Devices*, 2nd ed. pp. 681–742 (1981). To date, most commercially available laser diodes are fabricated from Group III–V compound semiconductors and their alloys such as GaAs and AlGaAso These devices emit light in the infrared and red portions of the spectrum, e.g., at wavelengths between 630 and 1550 nm. Laser diodes of these types are used in a wide range of applications such as communications, recording, sensing and imaging systems.

Nonetheless, there are many applications for which the wavelength of light generated by infrared and red laser diodes is not suitable. Commercially viable laser diodes which emit radiation at shorter wavelengths, for example in the green and blue portions of the spectrum (ie., at wavelengths between 590 and 430 nm) would have widespread application. Shorter wavelength laser diodes would also increase the performance and capabilities of many systems which currently use infrared and red laser diodes.

Wide band gap II–VI semiconductors and alloys, and in particular ZnSe, have for many years been called promising materials for the fabrication of blue and green light emitting devices. In the 1960's, laser action was demonstrated in several II–VI semiconductors using electron-beam pumping techniques. Colak et al., *Electron Beam Pumped II–VI Lasers*, J. Crystal Growth 72, 504 (1985) includes a review of this work. There have also been more recent demonstrations of photopumped and electron-beam pumped lasing action from epitaxial II–VI semiconductor materials. See eg., Potts et al., *Electron Beam Pumped Lasing In ZnSe Grown By Molecular-Beam Epitaxy*, Appl. Phys. Lett., 50, 7 (1987) and Ding et al., *Laser Action In The Blue-Green From Optically Pumped (Zn, Cd)Se/ZnSe Single Quantum Well Structures*, Appl. Phys. Lett. 57, p. 2756 (1990). As research on wide band gap II–VI semiconductor devices progressed, several key technological difficulties were identified. These difficulties included: 1) the inability to produce low-resistivity p-type ZnSe and related alloys; 2) the inability to form device-quality ohmic contacts to p-type ZnSe and related alloys, and 3) the lack of a suitable lattice-matched heterostructure material system.

Modern epitaxial growth techniques such as molecular beam epitaxy (MBE) and metalorganic chemical vapor deposition (MOCVD) are now used to fabricate device quality undoped and n-type ZnSe layers, typically on GaAs substrates. The growth of low resistivity p-type ZnSe using Li and N ($NH_3$) as dopants has also been reported. For some time it appeared that the upper limit of obtainable net acceptor concentrations ($N_A-N_D$) was about $10^{17} cm^{-3}$. Recently, however, significantly greater net acceptor concentrations have been achieved in ZnSe:N grown by MBE using nitrogen free radicals produced by an rf plasma source. See eg., Park et al., *P-type ZnSe By Nitrogen Atom Beam Doping During Molecular Beam Epitaxial Growth*, Appl. Phys. Lett. 57, 2127 (1990) and copending Park et al. U.S. Pat. application Ser. No. 07/573,428 filed Aug. 24, 1990, now U.S. Pat. No. 5,248,631 issued on Sep. 28, 1993, entitled Doping Of IIB–VIA Semiconductors During Molecular Beam Epitaxy. The largest net acceptor concentration in ZnSe achieved through the use of these techniques is $2 \times 10^{18} cm^{-3}$. Using these technologies, rudimentary blue light emitting diodes have been reported by several laboratories. See eg., the Park et al. Appl. Phys. Lett. article referred to immediately above.

Of the wide band gap II–VI semiconductor systems that are reasonably well developed, ie., ZnSeTe, CdZnSe, ZnSSe and CdZnS, only CdZnS–ZnSe offers a lattice-matched system. Unfortunately, this system offers only a very small band gap difference (about 0.05 eV), which is far too small for the carrier confinement needed for simple double heterostructure laser diodes. Therefore, to achieve a band gap difference greater than 0.2 eV, it would be necessary to use a strained-layer system (eg., ZnSe-$Cd_xZn_{1-x}$Se with x≧0.2). To prevent misfit dislocations which degrade the luminescence efficiency, the thickness of the strained layer should be kept less than the critical thickness. However, a simple double heterostructure laser made accordingly would have an active layer thickness so thin (due to the large mismatch required for sufficient band gap difference) that the optical mode would be very poorly confined. Thus, the confinement factor (overlap between the optical mode and the light generating region) would be small, and substrate losses would be high, causing prohibitively high threshold currents. Therefore, simple double heterostructure laser diodes are not practical in these wide band gap II–VI materials.

For these reasons, there have been no known demonstrations of laser diodes fabricated from II–VI compound semiconductors. Commercially viable laser diodes of this type would be extremely desirable and have widespread application.

SUMMARY OF THE INVENTION

The present invention is a II–VI compound semiconductor laser diode including a plurality of layers of II–VI semiconductor forming a pn junction. The layers forming the pn junction include a first cladding layer of a first conductivity type, a second cladding layer of a second conductivity type, and at least a first guiding layer between the first and second cladding layers. A quantum well active layer of II–VI semiconductor is positioned within the pn junction. The layers of II–VI semiconductor are supported by a single crystal semiconductor substrate. Electrical energy is coupled to the device by first and second electrodes on opposite sides of the layers of II–VI semiconductor. A preferred embodiment of the invention is a laser diode including a CdZnSe quantum well active layer.

BRIEF DESCRIPTION OF THE DRAWINGS

FIG. 5 is a graph of the measured optical power output from the laser diode shown in FIG. 1 as a function of applied current.

Figure 1:
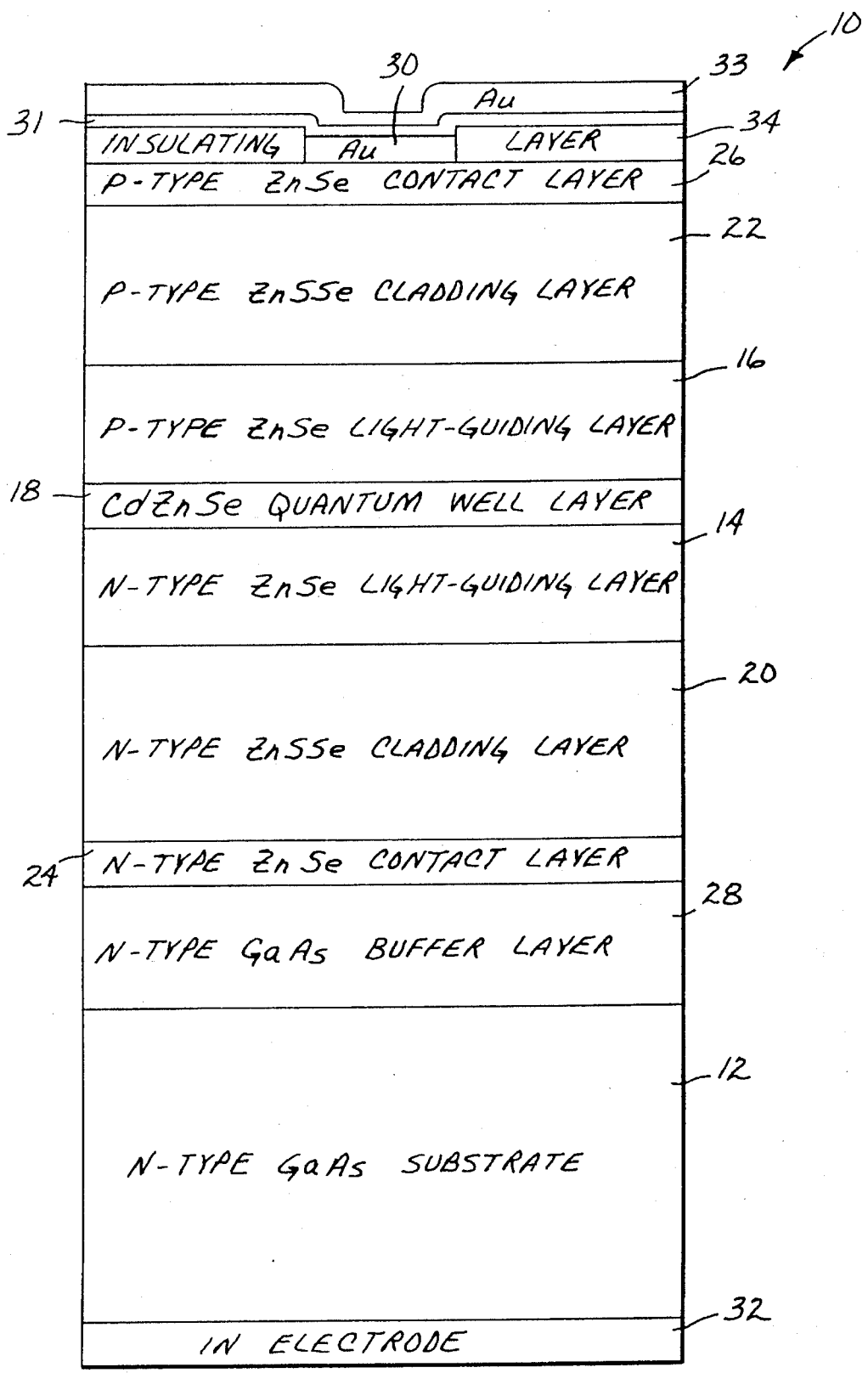
FIG. 1 is a cross sectional view (not to scale) illustrating the structure of a II–VI semiconductor laser diode in accordance with the present invention.

FIG. $6_1$ is a graph of the measured intensity of both the spontaneous (non-lasing) and stimulated (lasing) light output from the laser diode shown in FIG. 1 as a function of wavelength.

FIG. $6_2$ is a detailed illustration of the central wavelength portion of the graph of the stimulated light output in FIG. $6_1$.

Figure 7:
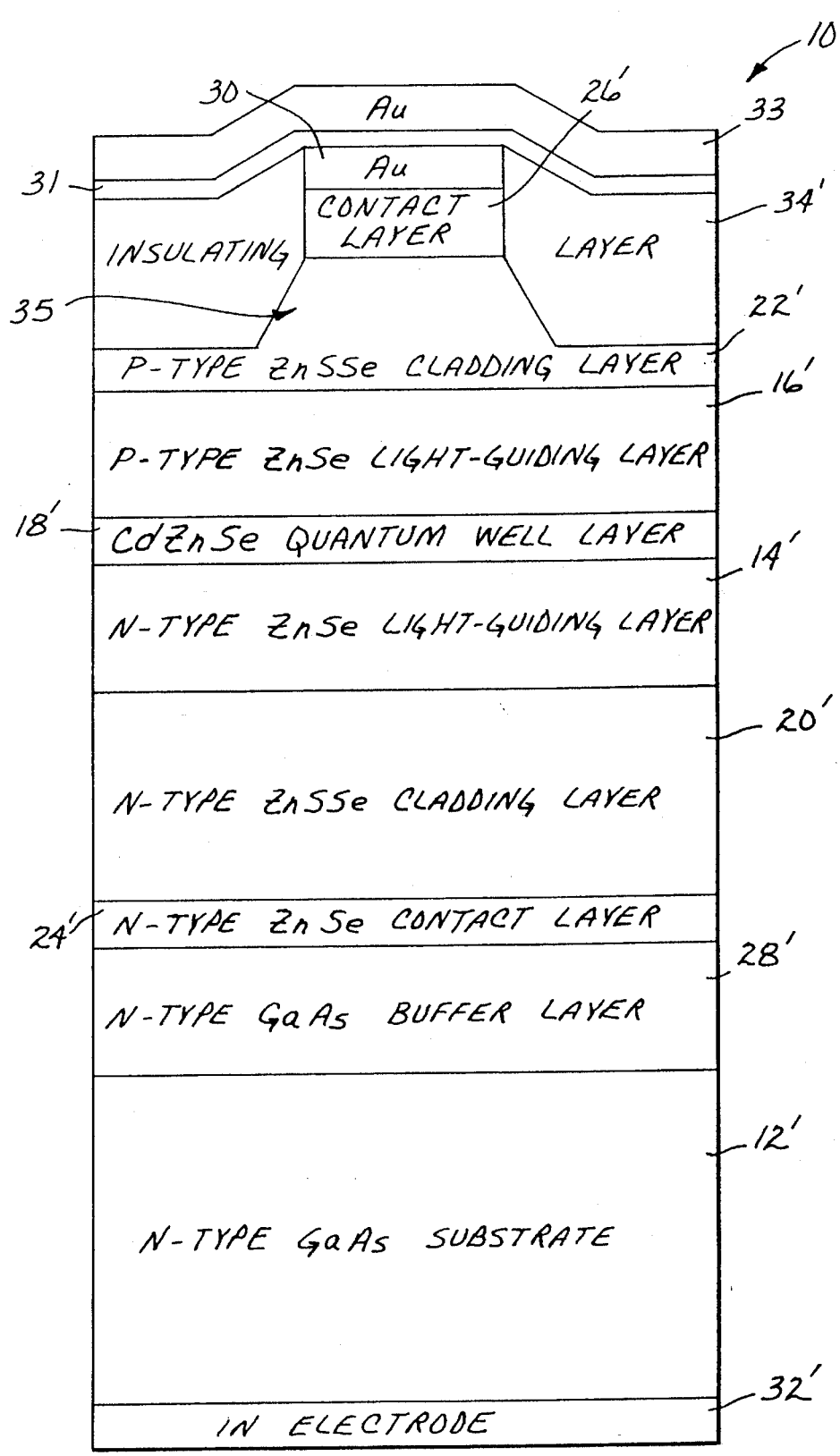

FIG. 7 is a cross sectional view illustrating the structure of an alternative rib waveguide embodiment of the laser shown in FIG. 1.

Figure 8:
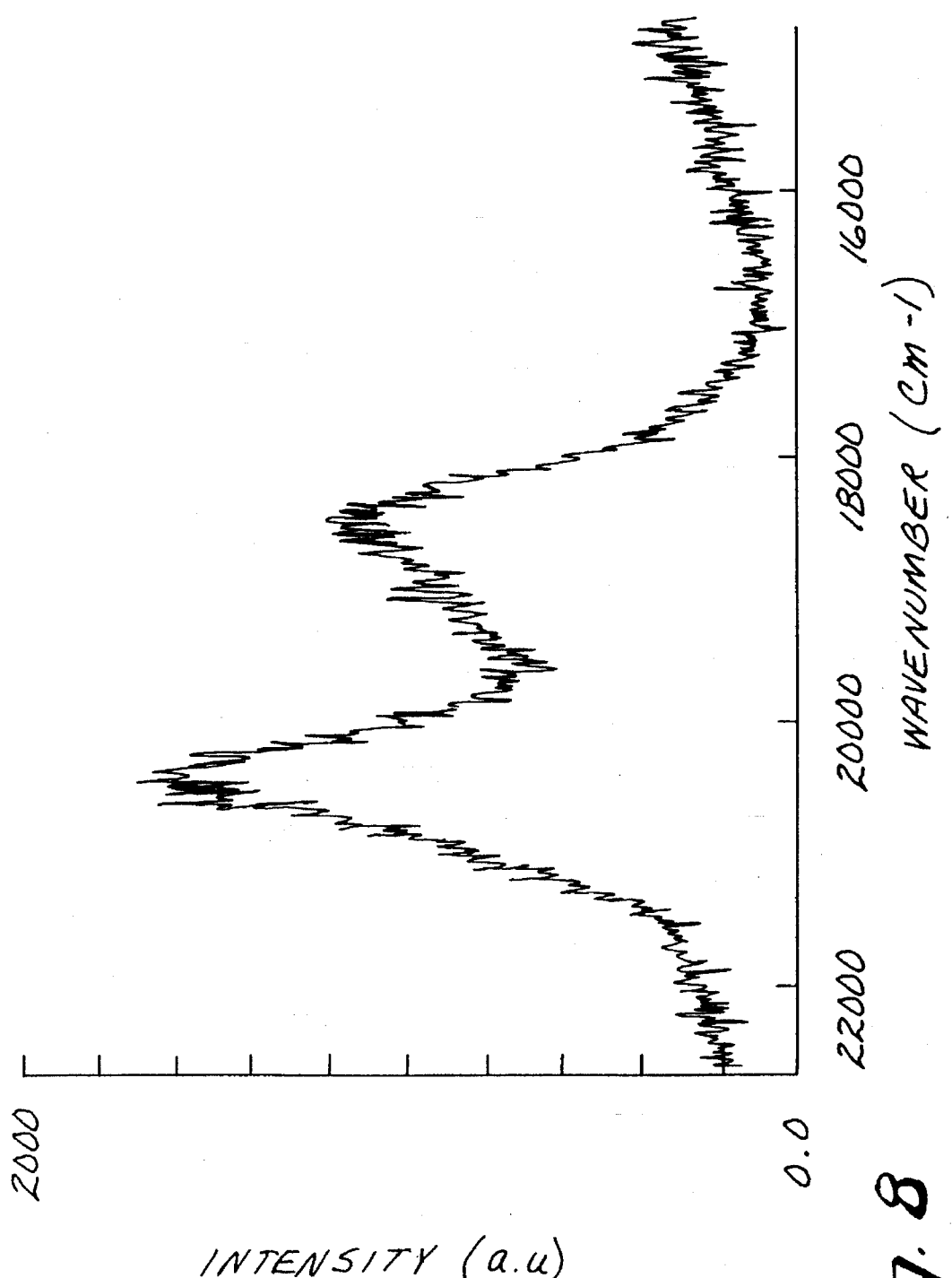

FIG. 8 is a graph of the low-temperature photoluminescence (PL) spectrum of the p-type ohmic contact layer sample similar to that incorporated into the laser diode shown in FIG. 1.

DETAILED DESCRIPTION OF THE PREFERRED EMBODIMENTS

The structure of a laser diode 10 in accordance with the present invention is illustrated generally in FIG. 1. Laser diode 10 is a wide band gap II–VI device fabricated from heteroepitaxial layers of $ZnS_xSe_{1-x}$, ZnSe and $Cd_yZn_{1-y}Se$ grown by molecular beam epitaxy (MBE) on a GaAs substrate. Prototypes of this device have exhibited laser action, emitting coherent blue-green light near 490 nm from a $Cd_yZn_{1-y}Se$ quantum well structure under pulsed current injection at 77 K.

Laser diode 10 is fabricated on a GaAs substrate 12, and includes lower (first) and upper (second) ZnSe light-guiding layers 14 and 16, respectively, separated by a $Cd_{1-y}Zn_ySe$ quantum well active layer 18. The surfaces of light-guiding layers 14 and 16 opposite active layer 18 are bounded by lower and upper $ZnS_xSe_{1-x}$ cladding layers 20 and 22, respectively. A lower ZnSe ohmic contact layer 24 is positioned on the surface of lower cladding layer 20 opposite light-guiding layer 14, while an upper ZnSe ohmic contact layer 26 is positioned on the surface of upper cladding layer 22 opposite light-guiding layer 16. A GaAs buffer layer 28 separates substrate 12 from lower ZnSe contact layer 24 to assure high crystalline quality of the contact and subsequently deposited layers. A polyimide insulating layer 34 covers the surface of upper ohmic contact layer 26 opposite upper cladding layer 22. Electrical contact to the ohmic contact layer 26 is made by Au electrode 30 which is formed in a window stripe in insulating layer 34. A thin Ti layer 31 and subsequently a final Au layer 33 are applied over polyimide layer 34 and exposed portions of Au electrode 30 to facilitate lead bonding. Electrical contact to the lower side of laser diode 10 is made by an In electrode 32 on the surface of substrate 12 opposite the lower ohmic contact layer 24.

Layers 24, 20 and 14 are all doped n-type with Cl (ie., are of a first conductivity type) in prototypes of laser diode 10. Layers 16, 22 and 26 are all doped p-type with N (ie., are of a second conductivity type). Active layer 18 is an undoped quantum well layer of $Cd_{0.2}Zn_{0.8}Se$ semiconductor deposited to a thickness of 0.01 μm. Light-guiding layers 14 and 16 are both 0.5 μm thick. Lower light-guiding layer 14 is doped to a net donor concentration of $1\times10^{17} cm^{-3}$, while upper light-guiding layer 16 is doped to a net acceptor concentration of $2\times10^{17} cm^{-3}$. Cladding layers 20 and 22 are layers of $ZnS_{0.07}Se_{0.93}$ semiconductor deposited to thicknesses of 2.5 μm and 1.5 μm, respectively. The net donor concentration of the lower cladding layer is $1\times10^{18} cm^{-3}$. The net acceptor concentration of the upper cladding layer is $2\times10^{17} cm^{-3}$. Ohmic contact layers 24 and 26 are both deposited to a thickness of 0.1 μm in these prototype devices. The lower contact layer is doped n-type to a net donor concentration of $1\times10^{18} cm^{-3}$. The upper contact layer is doped p-type to a net acceptor concentration of $1\times10^{18} cm^{-3}$.

Other parameters and materials can also be used in the fabrication of laser diodes 10 in accordance with the present invention. For example, the thicknesses of layers 24, 20, 14, 16, 22 and 26 can be varied as needed for given applications. Typical thickness ranges for contact, cladding and light-guiding layers are 0.03 to 1.0 μm, 0.5 to 5.0 μm, and 0.1 to 1.0 μm, respectively. In general, the thicknesses of light-guiding layers 14 and 16 should be chosen to minimize the width of the optical mode. If the layers 14 and 16 are too thin, the evanescent tails will extend far into cladding layers 20 and 22. Cladding layers 20 and 22 must be thick enough to make absorption of the optical mode in substrate 12 and electrode 32 negligible. The composition of the $Cd_xZn_{1-x}Se$ (which determines the laser wavelength) with x of approximately 0.2 was selected to provide a large enough band gap difference ($\Delta E_g$ of approximately 0.2 eV) to facilitate effective carrier confinement. Larger x will provide deeper quantum wells, but would require a thinner layer due to increased lattice mismatch, thereby decreasing the efficiency of the collection of carriers into the well.

The composition of the $ZnS_ySe_{1-y}$ with of approximately 0.07 was selected to provide sufficient difference in refractive index from the index of the ZnSe guiding layers to form a low-loss waveguide. This composition also provides excellent morphology since it is nearly lattice matched to the GaAs substrate at the growth temperature of 300° C.

Other n-type dopants which may be used include Ga, Al, In, I, F, and Br. Oxygen or Li acceptors can also be used for the p-type dopants. Other Group V p-type dopants which might be used include arsenic and phosphorous. Greater donor and acceptor concentrations can also be used, although they should not be so high as to cause excessive free-carrier absorption.

The prototypes of laser diode 10 are fabricated on Si-doped n+-type GaAs substrate 12 having a (100) crystal orientation. Substrates 12 of this type are commercially available from a number of manufacturers including Sumitomo Electric Industries, Ltd. GaAs buffer layer 28 is deposited to a thickness of 1 μm in this embodiment, and doped n+ with Si to a net donor concentration of $1\times10^{18} cm^{-3}$. Other appropriate substrates (eg., ZnSe, GainAs or Ge) and buffer layers such as AlGaAs, AlAs, GaInP, AiInP, AlInAs or GainAs can also be used. The thickness of buffer layer 28 can also be varied while providing an appropriate high-quality surface for growing the II–VI semiconductors. If an appropriate high-quality substrate and appropriate surface preparation is used, buffer layer 28 may not be needed.

The lattice constants of the ZnSSe cladding layers 20 and 22 and the adjacent ZnSe layers 24, 14 and 16, 26, respectively, are mismatched by about 0.3%. Preliminary transmission electron microscopy (TEM) studies indicate that the ZnSe of light-guiding layers 14 and 16 is at least partially relaxed by dislocations formed at the interfaces of the light-guiding layers and the adjacent ZnSSe cladding layers 20 and 22, respectively. These preliminary studies also indicate that the thickness of the CdZnSe quantum well active layer 18 is less than the critical thickness for this material system. Quantum well active layer 18 is therefore pseudomorphic, minimizing dislocations in the light-emitting region of laser diode 10. The maximum pseudomorphic thicknesses for strained epitaxial layers such as 18 depends on the composition and can be calculated from formulae described in Matthews et al., *Defects In Epitaxial Multilayers*, J. Crystal Growth, vol. 27, p. 118 (1974). The inclusion of quantum well layer 18, which could also be a pseudomorphic layer of other semiconductor material such as ZnSeTe, facilitates the low threshold current operation of laser diode 10 when positioned within the thicker, low-loss II–VI waveguide. The waveguide can be made with higher refractive index light-guiding layers 14 and 16 and lower refractive index cladding layers 20 and 22 which can have a relatively small difference in their band gaps and need not be exactly lattice matched. The composition of the light-guiding layers may be graded to minimize dislocations and/or to form a graded index waveguide.

Figure 2:
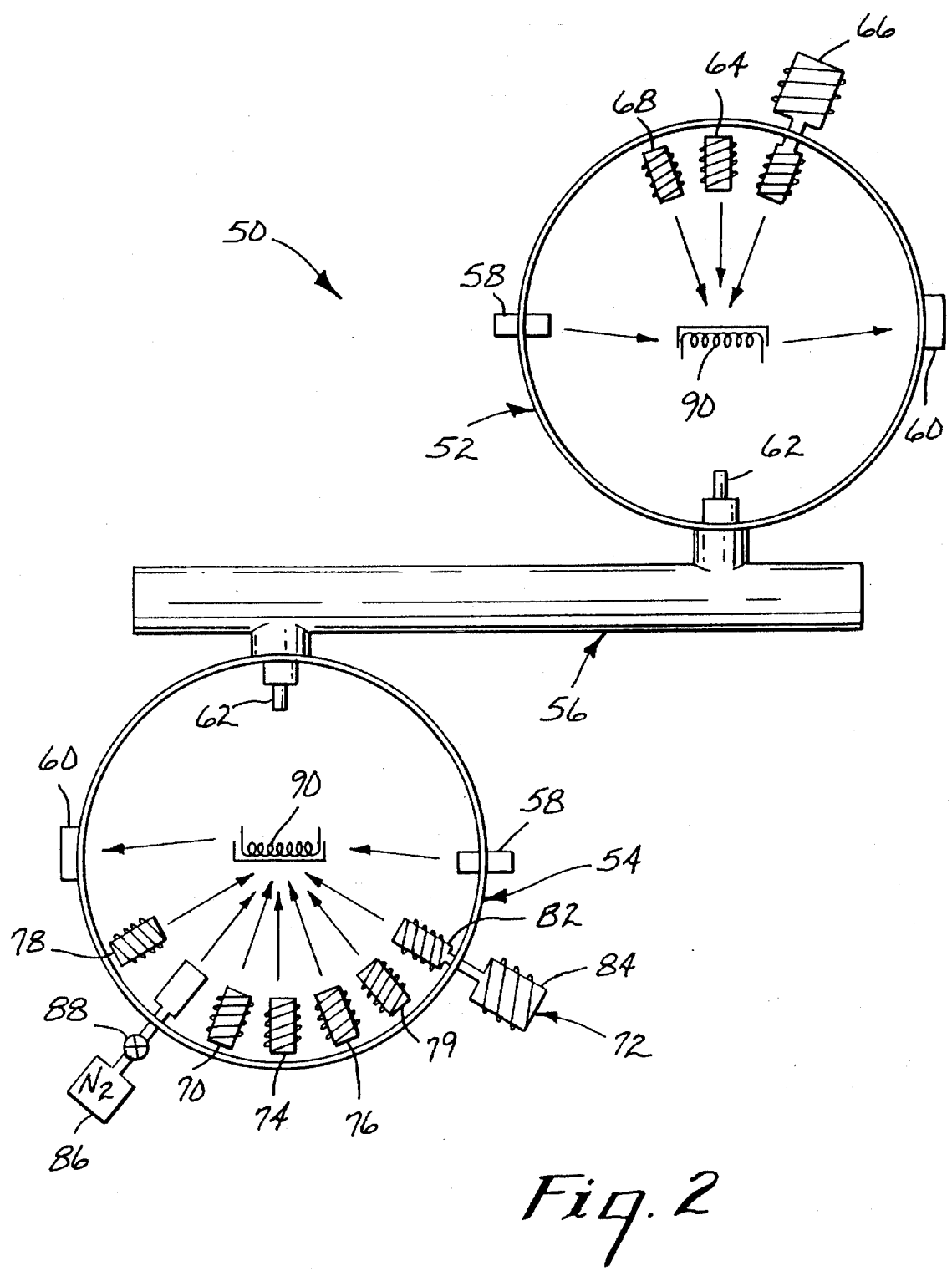
FIG. 2 is a schematic illustration of a molecular beam epitaxy system used to fabricate the laser diode shown in FIG. 1.

FIG. 2 is an illustration of a molecular beam epitaxy (MBE) system 50 used to fabricate the laser diode 10 described above. MBE system 50 includes two MBE chambers 52 and 54 interconnected by ultrahigh vacuum (UHV) pipeline 56. Each chamber 52 and 54 includes a high energy electron gun 58, a phosphorus screen 60, a substrate heater 90 and a flux monitor 62. MBE chambers such as 52 and 54 are generally known and commercially available. A Perkin-Elmer Model 430 MBE system was used to produce the prototype laser diodes 10.

MBE chamber 52 is used to grow the GaAs buffer layer 28 on substrate 12 and includes a Ga effusion cell 64 and an As cracking cell 66. A Si effusion cell 68 is also provided as a source of n-type dopants. Substrate 12 is cleaned and prepared using conventional or otherwise known techniques, and mounted to a Molybdenum sample block (not shown in FIG. 2) by In solder before being positioned within chamber 52. By way of example, substrate preparation techniques described in the Cheng et al. article *Molecular-Beam Epitaxy Growth Of ZnSe Using A Cracked Selenium Source*, J. Vac. Sci. Technol., B8, 181 (1990) were used to produce the prototype laser diode 10. The Si doped buffer layer 28 can be grown on substrate 12 by operating MBE chamber 52 in a conventional manner, such as that described in *Technology and Physics of Molecular Beam Epitaxy*, ed. E. H. C. Parker, Plenum Press, 1985. The resulting buffer layer 28 has an Asrich surface which exhibited a c(4×4) reconstruction as observed by reflection high energy electron diffraction (RHEED). The sample block bearing the GaAs substrate 12 and buffer layer 28 is then transfered to MBE chamber 54 through UHV pipeline 56 for further processing.

Device layers 24, 20, 14, 18, 16, 22, and 26 are all grown on the buffer layer 28 and GaAs substrate 12 within MBE chamber 54. To this end, chamber 54 includes a Zn effusion cell 70, cracked-Se effusion cell 72, ZnS effusion cell 74 (as a source of S), Cd effusion cell 76 and a standard Se (ie., primarily $Se_6$) effusion cell 79. As shown, cracked-Se effusion cell 72 includes a bulk evaporator 84 and high temperature cracking zone 82, and provides a source of cracked Se (including $Se_2$ and other Se molecules with less than 6 atoms). The bulk evaporator 84 and high temperature cracking zone 82 used to produce the prototype laser diodes 10 are of a custom design, the details and capabilities of which are described in the Cheng et al. J. Vac. Sci. Technol. article referenced above. C1 effusion cell 78 which utilizes $ZnCl_2$ source material provides the Cl n-type dopant. The p-type dopant is provided by N free-radical source 80. Free-radical source 80 is connected to a source 86 of ultra-pure $N_2$ through leak-valve 88. The free-radical source 80 used in the fabrication of laser diodes 10 is commercially available from Oxford Applied Research Ltd. of Oxfordshire, England (Model No. MPD21). This source has a length of 390 mm. The beam exit plate at the end of the source is made of pyrolytic boron nitride (PBN) and has nine 0.2 mm diameter holes through it. This source is mounted on a standard port for an effusion cell through a 10" extension tube. $N_2$ source 86 used to fabricate laser diodes 10 is of research purity grade, produced by Matheson Gas Products. The pressure at the inlet of the leak-valve of source 86 is 5 psi.

MBE chamber 54 is operated in a manner described in the Cheng et al. article *Growth Of p- and n- Type ZnSe By Molecular Beam Epitaxy*, J. Crystal Growth 95, 512 (1989) using the $Se_6$ source 79 as the source of Se to grow the n-type contact, cladding and light-guiding layers 24, 20 and 14, respectively, of the prototype laser diode 10. Quantum well active layer 18 is grown in a manner described in the Samarth et al. article, *Molecular Beam Epitaxy of CdSe and the Derivative Alloys $Zn_{1-x}Cd_xSe$ and $Cd_{1-x}Mn_xSe$*, J. Electronic Materials, vol. 19. No. 6, p. 543 (1990).

MBE chamber 54 is operated in a manner described in the Park et al. U.S. Pat. No. 5,248,631, issued Sep. 28, 1993 and entitled Doping Of IIB–VIA Semiconductors During Molecular Beam Epitaxy, using the $Se_6$ source 79 to grow the p-type light-guiding layer 16 and cladding layer 22. The disclosure contained in the above-referenced Park et al. U.S. Pat. No. 5,248,631 is incorporated herein by reference. Lower ZnSSe cladding layer 20 is doped n-type using the $ZnCl_2$ source. Other aspects of the techniques used to grow cladding layers 20 and 22 are described in the Matsumura et al. article, *Optimum Composition In $MBE-ZnS_xSe_{1-x}/ZnSe$ For High Quality Heteroepitaxial Growth*, J. Crys. Growth, vol. 99, p. 446 (1990).

Figure 3:
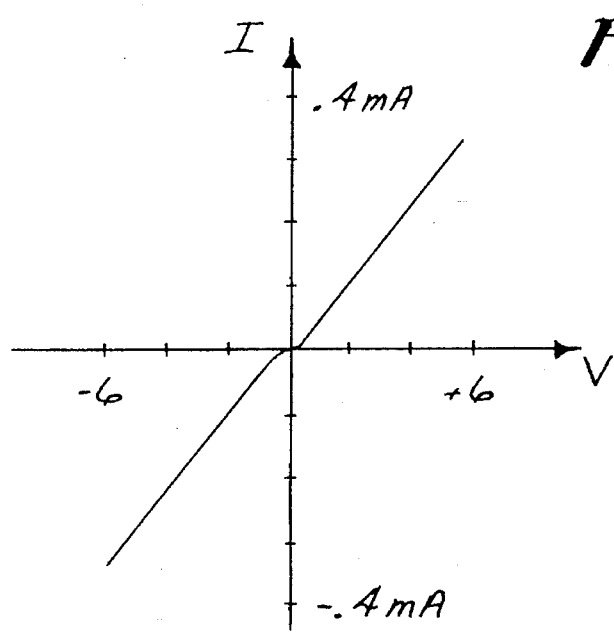
FIG. 3 is a graph of the I–V characteristic of sample Au ohmic contacts on p-type ZnSe and similar to that incorporated into the laser diode shown in FIG. 1.

A low resistivity p-type ZnSe ohmic contact layer 26 has been achieved by growing the contact layer at low temperature within MBE chamber 54 utilizing the cracked Se source 72 (ie., cracking zone 82 and evaporator 84), while at the same time doping the semiconductor material of the contact layer p-type in accordance with the above-referenced Park U.S. Pat. No. 5,248,631. The low temperature growth technique used to produce the contact layer 26 of the prototype laser diode 10 is described generally in the Cheng et al. article *Low Temperature Growth Of ZnSe By Molecular Beam Epitaxy Using Cracked Selenium*, Appl. Phys. Lett. (Feb. 1990). The semiconductor body with layers 28, 24, 20, 14, 18, 16 and 22 on substrate 12 is heated to a temperature less than 250° C. but high enough to promote crystalline growth of the ZnSe doped with the N p-type dopants to a net acceptor concentration of at least $1\times10^{17} Cm^{-3}$. A net acceptor concentration of $1\times10^{18} cm^{-3}$ was achieved in the ohmic contact layer 26 of prototype laser diodes 10, when grown at a substrate temperature of about 150° C. However, it is anticipated that ohmic contact layers 26 with acceptable characteristics can be achieved at other growth temperatures down to at least 130° C. Other operating parameters of MBE chamber 54 used to produce the ohmic contact layer 26 of the prototype laser diodes 10 are as follows:

Zn beam equivalent pressure: 1.0×10⁻⁷ Torr*
Se cracking zone temperature: 600° C.*
Se bulk evaporator temperature: 250° C.*
Growth rate: 0.3–0.6 μm/hr
Surface reconstruction: Zn-stabilized
Nitrogen pressure in chamber: >3.5×10⁻⁷ Torr*
rf power: 150–250 W*
* parameters dependant upon specific MBE system configuration FIG. 3 is the current-voltage characteristic of a sample with two coplanar Au metal electrodes on a p-type ZnSe contact layer produced for test purposes in a manner substantially similar to that described above. The ohmic nature of this contact is indicated by the substantially linear nature of the curve over the −6 to +6 volt range.

Figure 4:
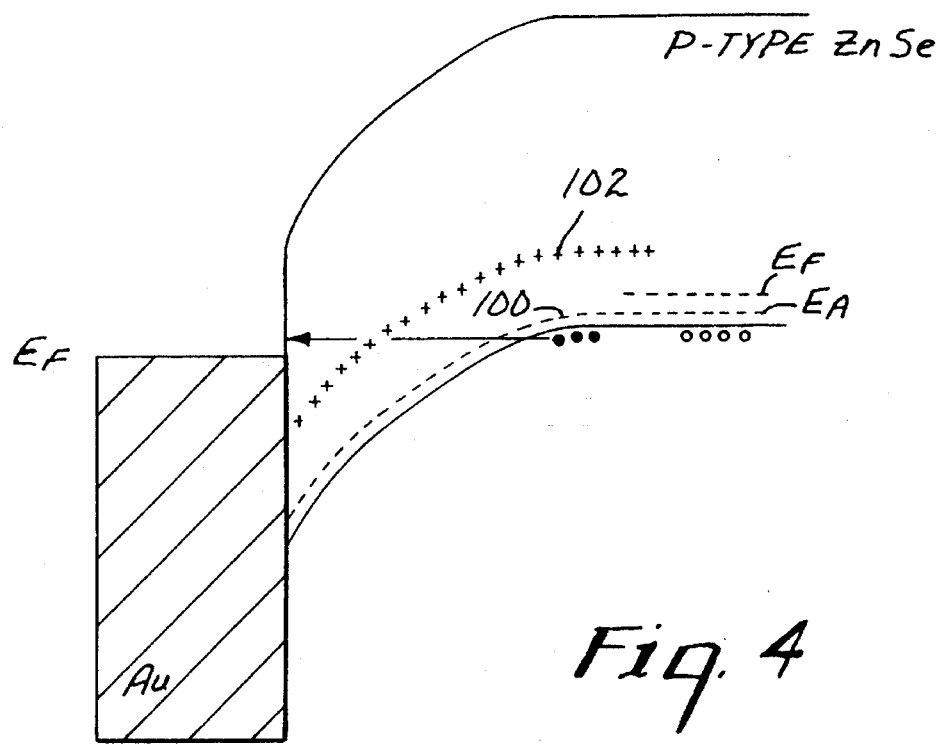
FIG. 4 is an energy band diagram of an ohmic contact to p-type ZnSe which is similar to that incorporated into the laser diode shown in FIG. 1.

The mechanisms believed to enable the ohmic nature of contact layer 26 can be described with reference to FIG. 4 which is an energy band diagram of the Au—p-type ZnSe contact layer interface. In addition to the expected shallow impurities 100 utilized by conventional ohmic contacts, additional electronic energy states 102 are formed in the contact layer. These additional energy states 102 are relatively deep (within the forbidden gap) with respect to the valence band maximum, compared to the depth of the shallow impurity level 100. Energy states 102 are in effect intermediate energy states located at an energy less than the Au Fermi level and greater than the shallow impurity level 100. Since the probability of charge carriers tunneling between two given energy states increases exponentially with decreasing distance between the two states, additional energy states 102 greatly increase the tunneling probability by providing a temporary residence for the carriers and facilitate multi-step or cascade tunneling. The optimum condition is illustrated in FIG. 4 where $E_F$ is the Fermi energy and $E_A$ is the acceptor energy. A diagramatic depiction of an electron making a multi-step tunneling transfer between the ZnSe and Au layers through the additional energy states 102 is also shown in FIG. 4. Even better contacts are attainable with electronic states at more than one energy level, such that tunneling can occur from state to state across the barrier.

It is anticipated that the introduction of additional energy states 102 can be achieved by a number of methods. Doping during growth, diffusion, ion implantation or other known techniques can be used to incorporate impurities which produce deep levels. One important type of deep level impurity is the iso-electronic trap. By way of example, Te is thought to form a hole trap in ZnSe. The additional energy states 102 can also be achieved by introducing proper native crystal defects such as, but not limited to, dislocations, vacancies, interstitials or complexes into contact layer 26. This can be done during the deposition of the contact layer by choosing the molecular species of the precursors, and/or by other appropriate growth conditions. Native defects can also be generated by post-growth treatments such as irradiation by electron beams, ion beams, radical beams or electromagnetic radiation. However, these techniques must be implemented without detrimentally degrading the conductivity of the ZnSe or other semiconductor material used for the contact layer.

It therefore appears that the useful p-type contact layer 26 has a number of properties. The net acceptor density $N_A-N_D$ is large, preferrably at least $1\times10^{18} cm^{-3}$. This serves to reduce the width of the barrier through which the charge carriers must tunnel. The p-type dopant concentration (nitrogen in laser diode 10) must also be large, preferrably at least $1\times10^{19} cm^{-3}$. In addition to forming the shallow acceptor levels, the nitrogen impurities also appear to participate in the formation of the deep energy states. At a minimum, the amount of nitrogen required is that which will provide adequate concentrations of both types of levels. The growth conditions must also be appropriate to form the defects at the energy levels described above. The low temperature growth technique described above has been shown to produce these material properties (contact resistances less than 0.4 ohm-cm² have been achieved).

The low-temperature photoluminescence (PL) spectrum from a good ohmic contact layer such as 26 is shown in FIG. 8. The observed characteristics include: 1) the very weak near band edge PL; 2) the appearance of the defect band at 2.3 eV (18,500 cm⁻¹); and 3) the presence of a band (presumably associated with donor-acceptor-pair recombination) at about 2.5 eV (20,400 cm⁻¹). The band edge PL is expected to be weak for materials which have significant concentrations of deep levels since the deep levels provide long wavelength and nonradiative channels which compete with the near band edge processes. The emission band at approximately 2.3 eV is associated with a transition from the conduction band to a deep (acceptor) level about 0.5 eV above the valence band maximum. This is near the energy position that is believed to be the most effective for cascade tunneling. The emission band at 2.5 eV is believed to be related to transitions from donor to acceptor states. No or minimal donor states would be preferrable, eliminating this transition, or shifting its occurance to slightly higher energies.

In general, and other than the differences described below, conventional processes (ie., those used for Si and III-V semiconductor devices) are used to complete the fabrication of prototype laser diode 10. Following the deposition of contact layer 26, the as yet incomplete laser diode 10 is removed from MBE chamber 54. Electrode 30 includes Au which is vacuum evaporated onto contact layer 26 and patterned into a stripe (typically about 20 μm wide) using conventional photolithography and lift-off. An insulating layer 34 of is then applied over electrode 30 and the exposed surface of contact layer 26. For an insulator that can be applied at low temperatures, polyimide photoresist is preferred. Probimide 408 from Ciba-Geigy Corp. was used to produce laser diode 10. A stripe (about 20 μm wide) of the polyimide layer 34 directly above electrode 30 is removed by UV exposure through a photomask and development using the manufacturer's recommended processing recipe, except for the post-development cure. To cure the developed polyimide, the device was flood exposed to 1 J/cm² of UV light from a mask aligner, and baked at 125° C. on a hot plate in air for 3 minutes. Ti-Au layer 31 is then evaporated on the exposed surface of the Au electrode 30 and polyimide layer 34 to facilitate lead-bonding. The In used for MBE substrate bonding also served as electrode 32 on substrate 12. Opposite ends of the device were cleaved along (110) planes to form facet mirrors. Cavity length of the prototype devices 10 is about 1000 μm. Laser diodes 10 were then bonded p-side up to ceramic sample holders with silver-filled epoxy.

Improved performance of these laser devices can be gained by providing better lateral confinement of the optical mode. This can be achieved by forming an index-guided laser 10' such as that shown in FIG. 7. Index-guided laser 10' is similar to laser 10 and can be fabricated with the same II–VI semiconductor layers. Portions of laser 10' which correspond to those of laser 10 are indicated with identical but primed (ie., "X'") reference numerals. In the embodiment shown, laser 10' includes a waveguide or rib 35 in the cladding layer 22' and contact layer 26'. Rib 35 can be formed to a width of about 5 μm by ion beam etching with a Xe or Ar ion beam or by wet-chemical etching. Conventional photoresist can be used as a mask for this process. Other known and conventional techniques can also be used to provide lateral waveguiding. These techniques include using substrates in which grooves have been etched (ie., channelled-substrate lasers), or etching a rib and re-growing a top cladding layer (ie., a "buried heterostructure" laser). Improvements in the threshold current or the differential quantum efficiency may be achieved by dielectric coatings of the facets to adjust the reflectivities.

Initial tests of the prototype laser diodes 10 were conducted at 77 K by pulsing the devices, typically with 500 nsec pulses and a 500 μsec period. Current measurements were made with a box-car averager, while a large Si photodetector was used to collect and monitor the output light intensity from one end facet of the device. The measured light output as a function of current (ie., L–I) characteristics from one of the devices is illustrated in FIG. 5. The threshold current is 74 mA, which corresponds to a threshold current density of 320 A/cm$^2$. Differential quantum efficiencies in excess of 20% per facet have been measured, as have pulsed output powers of over 100 mW per facet. The coherent light is strongly TE polarized and a "speckle pattern" is clearly visible. The output laser beam has an elliptical far-field pattern, with a divergence of roughly 40°×4° for the central lobe. Side lobes are visible, indicating higher order transverse modes. The measured L–I characteristics, such as that shown in FIG. 5, do indicate some dependence on pulse length. At high current densities, the gain in the single quantum well prototype devices tends to saturate. At the same time, the index of refraction is reduced due to the injection of excess carriers, which tends to make the region under the stripe of electrode 30 anti-guiding. Thermal effects become important at these current densities, as thermal gradients and the temperature dependence of the index provide lateral optical confinement. It is expected that these characteristics will be alleviated by index-guided versions such as laser diode 10'.

Figure 6:
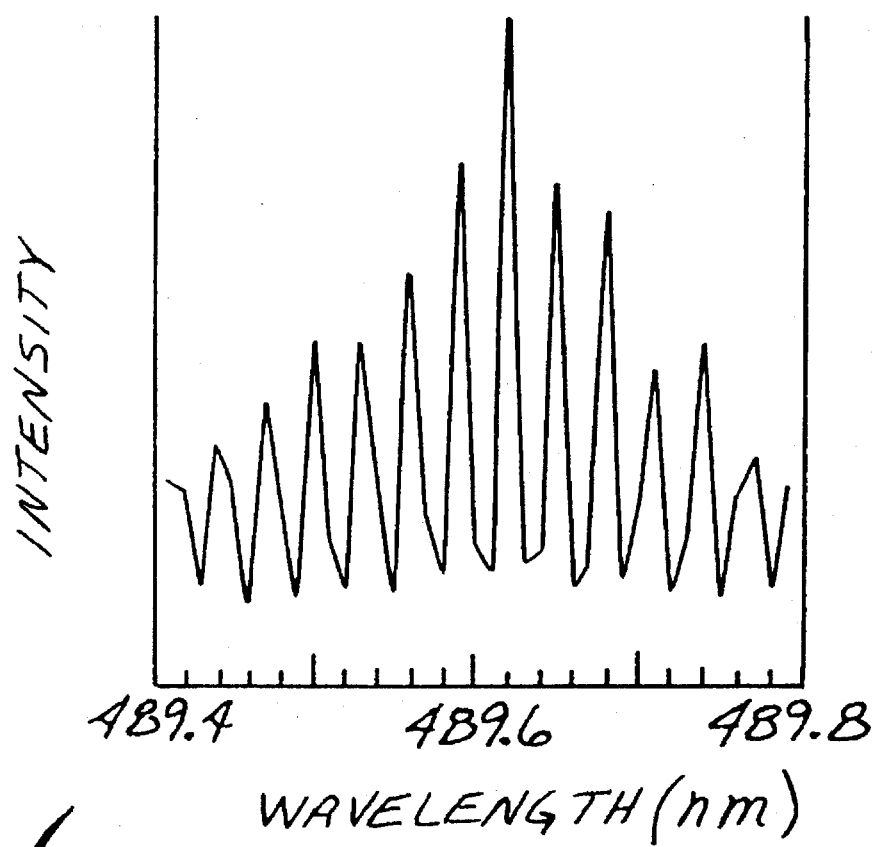

FIG. 6 is a graph of the optical spectra that are characteristic of the prototype laser diodes 10 at 77 K. The spectra illustrated in FIG. 6 were acquired using a SPEX 1403 double monochromator. At currents below threshold, the spontaneous emission occurs at 490 nm and has a FWHM of about 3 nm. Above threshold, the 1060 μm long device operates in many longitudinal modes centered at 489.6 μm, and which are separated by 0.03 nm.

Laser operation has been observed in the prototype laser diodes 10 for short periods of time at temperatures as high as 200 K. At room temperature the devices emit at 502 nm, but do not lase.

The operating voltage of the prototype laser diodes 10 at the threshold current is approximately 15 V. This characteristic indicates that there is still room for improvement in the ohmic contact between electrode 30 and contact layer 26 and/or improvement in the conductivity of p-type layers 16, 22, and 26. Reducing this series resistance and improving the heat-sinking of the device (ie., by solder-bonding the p-type type side down) are expected to facilitate CW operation at higher temperatures.

It is expected that the inventive concepts disclosed herein and used to fabricate the prototype laser diode 10 are equally well suited to the fabrication of laser diodes from a wide variety of other compound II-VI semiconductor alloys, especially from other ZnSe alloys. For example, improved operating characterisics will be achieved by using lattice matched materials such as $Cd_xZn_{1-x}S$ (with x of approximately 0.61) and ZnSe to form the waveguide. The quantum well in such a device may include CdZnSe. This semiconductor system will not suffer from misfit dislocations which can decrease efficiency and the useful lifetime of the devices. Also, a multiple quantum well active layer made of a strained-layer superlattice could replace the single pseudomorphic quantum well layer 18.

Ohmic contact layer 26 might also be improved by using thin layers of smaller band gap II–VI alloys such as $ZnSe_{1-x}Te_x$, $Cd_xZn_{1-x}Se$ and $Hg_xZn_{1-x}Se$. Group VI sources other than $Se_2$ can also be used to produce ohmic contacts in accordance with the present invention. Other Group VI species $X_m$ where m<6, as well as other sources of these species, should be suitable substitutes. Other metals (eg., Pt) or other electrically conductive materials having a large work function (eg., >5 eV) and suitable for a stable semiconductor interface can also be used as electrodes.

In conclusion, although the present invention has been described with reference to preferred embodiments, changes can be made in form and detail without departing from the spirit and scope of the invention.

What is claimed is:

1. A II–VI compound semiconductor laser diode, including:

a plurality of layers of II–VI semiconductor forming a pn junction, including:

a first cladding layer of a first conductivity type;

a second cladding layer of a second conductivity type; and at least a first guiding layer between the first and second cladding layers;

an active layer of II–VI semiconductor within the pn junction;

a semiconductor substrate for supporting the layers of II–VI semiconductor; and first and second electrodes for coupling electrical energy to the laser diode.

2. The II–VI laser diode of claim 1 wherein:

the first guiding layer includes a first guiding layer of the first conductivity type II–VI semiconductor adjacent the first cladding layer; and the plurality of layers of semiconductor forming the pn junction further include a second guiding layer of the second conductivity type II–VI semiconductor between the second cladding layer and the first guiding layer.

3. The II–VI laser diode of claim 1 wherein the active layer includes a multiple quantum well active layer.

4. The laser diode of claim 1 wherein the active layer includes a CdZnSe layer.

5. The laser diode of claim 1 wherein the active layer includes a ZnSe layer.

6. The laser diode of claim 1 and further including:

a first II–VI semiconductor ohmic contact layer of the first conductivity type between the substrate and the first cladding layer; and a second II–VI semiconductor ohmic contact layer of the second conductivity type between the second cladding layer and the second electrode.

7. An electronic system including a laser diode of the type characterized by claim 1 for emitting a coherent light beam in the blue and/or green portions of the spectrum.

8. A II–VI compound semiconductor laser diode including:

a plurality of layers of II–VI semiconductor forming a pn junction, including at least a first guiding layer;

an active layer of II–VI semiconductor within the pn junction;

a semiconductor substrate for supporting the layers of II–VI semiconductor; and first and second electrodes for coupling electrical energy to the laser diode.

9. The laser diode of claim 8 wherein the plurality of layers of II–VI semiconductor include:

a first guiding layer of II–VI semiconductor of a first conductivity type over the substrate; and a second guiding layer of II–VI semiconductor of a second conductivity type over the first guiding layer, the first and second guiding layers forming the pn junction.

10. An electronic system including a laser diode of the type characterized by claim 9 for emitting a coherent light beam in the blue and/or green portions of the spectrum.

11. The electronic system of claim 10 wherein the active layer of the laser diode includes a quantum well active layer.

12. The laser diode of claim 9 and further including:

a first cladding layer of II–VI semiconductor of the first conductivity type between the substrate and the first guiding layer; and a second cladding layer of II–VI semiconductor of the second conductivity type opposite the second guiding layer from the first guiding layer.

13. An electronic system including a laser diode of the type characterized by claim 12 for emitting a coherent light beam in the blue and/or green portions of the spectrum.

14. The electronic system of claim 13 wherein the active layer of the laser diode includes a quantum well active layer.

15. The laser diode of claim 8 wherein the active layer includes a quantum well active layer.

16. The laser diode of claim 15 wherein the quantum well active layer includes a multiple quantum well active layer.

17. An electronic system including a laser diode of the type characterized by claim 8 for emitting a coherent light beam in the blue and/or green portions of the spectrum.

18. An electronic communication system including a laser diode of the type characterized by claim 8 for emitting a modulated coherent light beam in the blue and/or green portions of the spectrum.

19. An optical data recording system including a laser diode of the type characterized by claim 8 for emitting a coherent light beam in the blue and/or green portions of the spectrum.

20. An optical sensing system including a laser diode of the type characterized by claim 8 for emitting a coherent light beam in the blue and/or green portions of the spectrum.

21. An optical imaging system including a laser diode of the type characterized by claim 8 for emitting a modulated coherent light beam in the blue and/or green portions of the spectrum.

22. The laser diode of claim 8 and further including a waveguide ridge in at least one of the layers of II–VI semiconductor.

23. The laser diode of claim 8 and further including:

a ridge formed in at least one of the layers of II–VI semiconductor; and a burying layer of II–VI semiconductor on opposite sides of the ridge, forming a buried-ridge waveguide for lateral optical and current confinement.

24. An optical communication, recording, sensing or imaging system including a housing and a II–VI compound semiconductor laser diode mounted within the housing for emitting a coherent light beam in the blue and/or green portions of the spectrum, the optical system including:

a semiconductor substrate of a first conductivity type within the housing;

a first cladding layer of II–VI semiconductor of a first conductivity type overlaying the substrate and within the housing;

a first guiding layer of II–VI semiconductor of the first conductivity type overlaying the first cladding layer and within the housing;

a second guiding layer of II–VI semiconductor of a second conductivity type overlaying and forming a pn junction with the first guiding layer and within the housing;

an active layer of II–VI semiconductor within the pn junction and within the housing;

a second cladding layer of II–VI semiconductor of the second conductivity type overlaying the second guiding layer and within the housing; and first and second electrodes within the housing, for coupling electrical energy to the pn junction.

25. The optical system of claim 24 wherein the laser diode further includes a waveguide ridge in at least one of the layers of II–VI semiconductor.

26. The optical system of claim 24 wherein the laser diode further includes:

a ridge formed in at least one of the layers of II–VI semiconductor; and a burying layer of II–VI semiconductor on opposite sides of the ridge, forming a buried-ridge waveguide for lateral optical and current confinement.

27. The optical system of claim 26 wherein the active layer of the laser diode includes a quantum well active layer.

28. An optical communication, recording, sensing or imaging system including a housing and a II–VI compound semiconductor laser diode mounted within the housing for emitting a coherent light beam in the blue and/or green portions of the spectrum, the optical system including:

a plurality of layers of II–VI semiconductor forming a pn junction, including at least a first guiding layer;

an active layer of II–VI semiconductor within the pn junction and within the housing;

a semiconductor substrate for supporting the layers of II–VI semiconductor and within the housing;

a ridge formed in at least one of the layers of II–VI semiconductor and within the housing; and first and second electrodes for coupling electrical energy to the laser diode and within the housing.

29. The optical system of claim 28 wherein the plurality of layers of II–VI semiconductor in the laser diode further includes:

a first cladding layer of II–VI semiconductor of a first conductivity type over the substrate; and a second cladding layer of II–VI semiconductor of a second conductivity type over the first cladding layer.

30. The optical system of claim 28 wherein the plurality of layers of II–VI semiconductor in the laser diode further includes:

a first guiding layer of II–VI semiconductor of a first conductivity type; and a second guiding layer of II–VI semiconductor of a second conductivity type over the first guiding layer.

31. The optical system of claim 28 wherein the laser diode further includes a burying layer of II–VI semiconductor on opposite sides of the ridge, forming a buried-ridge waveguide for lateral optical and current confinement.

32. A II–VI compound semiconductor laser diode comprising a semiconductor substrate, a plurality of layers of II–VI semiconductor forming a pn junction supported by the substrate, including a light-guiding layer and an active layer, and first and second electrodes for coupling electrical energy to the laser diode, for emitting a coherent light beam of at least about 1 mW in green and/or blue portions of the spectrum in response to an applied threshold current corresponding to a threshold current density of less than about 10000 A/cm$^2$.

33. The laser diode of claim 32 and further including at least one p-type layer of II–VI semiconductor doped with p-type dopants from a free radical source to a net acceptor concentration of at least $1\times10^{17}$cm$^{-3}$.

34. The laser diode of claim 33 wherein the p-type layer of II–VI semiconductor is doped with p-type dopants from the group consisting of nitrogen, arsenic and phosphorous.

35. The laser diode of claim 32 and further including at least one p-type layer of II–VI semiconductor doped with p-type dopants from a free radical source to a net acceptor concentration of at least $5\times10^{17}$cm$^{-3}$.

36. The laser diode of claim 32 and further including at least one p-type layer of II–VI semiconductor doped with p-type dopants from a free radical to a net acceptor concentration of at least $1\times10^{18}$cm$^{-3}$.

37. The laser diode of claim 32 wherein the active layer includes a quantum well active layer.

38. The laser diode of claim 37 wherein the quantum well active layer includes a multiple quantum well active layer.

39. The laser diode of claim 32 wherein the active layer includes zinc and selenium.

40. The laser diode of claim 32 wherein the active layer further includes cadmium.

41. An electronic system including a II–VI laser diode of the type characterized by claim 32 for emitting a coherent light beam in the blue and/or green portions of the spectrum.

42. An electronic communication system including a laser diode of the type characterized by claim 32 for emitting a modulated coherent light beam in the blue and/or green portions of the spectrum.

43. An optical data recording system including a laser diode of the type characterized by claim 32 for emitting a coherent light beam in the blue and/or green portions of the spectrum.

44. An optical sensing system including a laser diode of the type characterized by claim 32 for emitting a coherent light beam in the blue and/or green portions of the spectrum.

45. An optical imaging system including a laser diode of the type characterized by claim 32 for emitting a modulated coherent light beam in the blue and/or green portions of the spectrum.

46. The laser diode of claim 32 wherein the plurality of layers forming the pn junction include zinc and selenium.

47. The laser diode of claim 32 wherein the plurality of layers forming the pn junction include:
   a first guiding layer of semiconductor including zinc and selenium of a first conductivity type; and
   a second guiding layer of semiconductor including zinc and selenium of a second conductivity type.

48. The laser diode of claim 47 and further including:
   a first cladding layer of semiconductor including zinc and selenium of a first conductivity type between the substrate and the first guiding layer; and
   a second cladding layer of semiconductor including zinc and selenium of a second conductivity type opposite the second guiding layer from the active layer.

49. The laser diode of claim 48 wherein the first and second cladding layers of semiconductor include zinc, selenium and sulfur.

50. The laser diode of claim 48 wherein the active layer includes cadmium, zinc and selenium.

51. A laser diode of the type characterized by claim 32 and capable of emitting a coherent light beam of at least about 2mW in green and/or blue portions of the spectrum in response to an applied threshold current corresponding to a threshold current density of less than about 500 A/cm$^2$.

* * * * *

UNITED STATES PATENT AND TRADEMARK OFFICE
CERTIFICATE OF CORRECTION

PATENT NO. : 5,513,199
DATED : April 30, 1996
INVENTOR(S) : Michael A. Haase et al.

It is certified that error appears in the above-indentified patent and that said Letters Patent is hereby corrected as shown below:

Column 13, line 8, delete "10000" and insert therefor --1000--

Signed and Sealed this

Sixteenth Day of July, 1996

Attest:

BRUCE LEHMAN

Attesting Officer

Commissioner of Patents and Trademarks